(12) United States Patent
Seo

(10) Patent No.: US 7,464,309 B2
(45) Date of Patent: Dec. 9, 2008

(54) METHOD AND APPARATUS FOR TESTING SEMICONDUCTOR MEMORY DEVICE AND RELATED TESTING METHODS

(75) Inventor: Seong-Young Seo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 415 days.

(21) Appl. No.: 11/006,788

(22) Filed: Dec. 8, 2004

(65) Prior Publication Data
US 2005/0102595 A1 May 12, 2005

(30) Foreign Application Priority Data
Nov. 8, 2003 (KR) .............................. 2003-88677

(51) Int. Cl.
*G11C 29/00* (2006.01)
*G11C 7/00* (2006.01)
(52) U.S. Cl. ...................... 714/719; 365/201
(58) Field of Classification Search ................ 714/718, 714/719; 365/201
See application file for complete search history.

(56) References Cited
U.S. PATENT DOCUMENTS 5,469,390 A * 11/1995 Sasaki et al. ................ 365/200
5,961,653 A * 10/1999 Kalter et al. .................... 714/7
2002/0184578 A1* 12/2002 Yoshizawa ................... 714/718
2003/0115518 A1* 6/2003 Kleveland et al. ........... 714/718

FOREIGN PATENT DOCUMENTS

| JP | 2002042488 | 2/2002 |
|---|---|---|
| JP | 2002313077 | 10/2002 |
| JP | 2003085996 | 3/2003 |
| KR | 1020030043658 A | 6/2003 |

OTHER PUBLICATIONS

"Isolation merged bit line cell (IMBC) for 1 Gb DRAM and beyond" by PArk et al. This paper appears in: Electron Devices Meeting, 1995., International Publication Date: Dec. 10-13, 1995 On pp. 911-914 ISBN: 0-7803-2700-4 INSPEC Accession No. 5241840.*

* cited by examiner

*Primary Examiner*—Cynthia Britt
(74) *Attorney, Agent, or Firm*—Volentine & Whitt, PLLC

(57) ABSTRACT

A test method and apparatus for a semiconductor memory device is characterized by the sequentially programmed use of two test different modes. A first test mode tests at least signal line integrity for the semiconductor memory device by testing a merged set of bits line. The second test mode further tests at least signal line integrity after first separating the merged bits lines. Logical combination of test data derived from the first and second test modes are used to generate error detection signals. At least one bit line associated with a parity bit is preferable merged and separated in the foregoing approach.

27 Claims, 13 Drawing Sheets

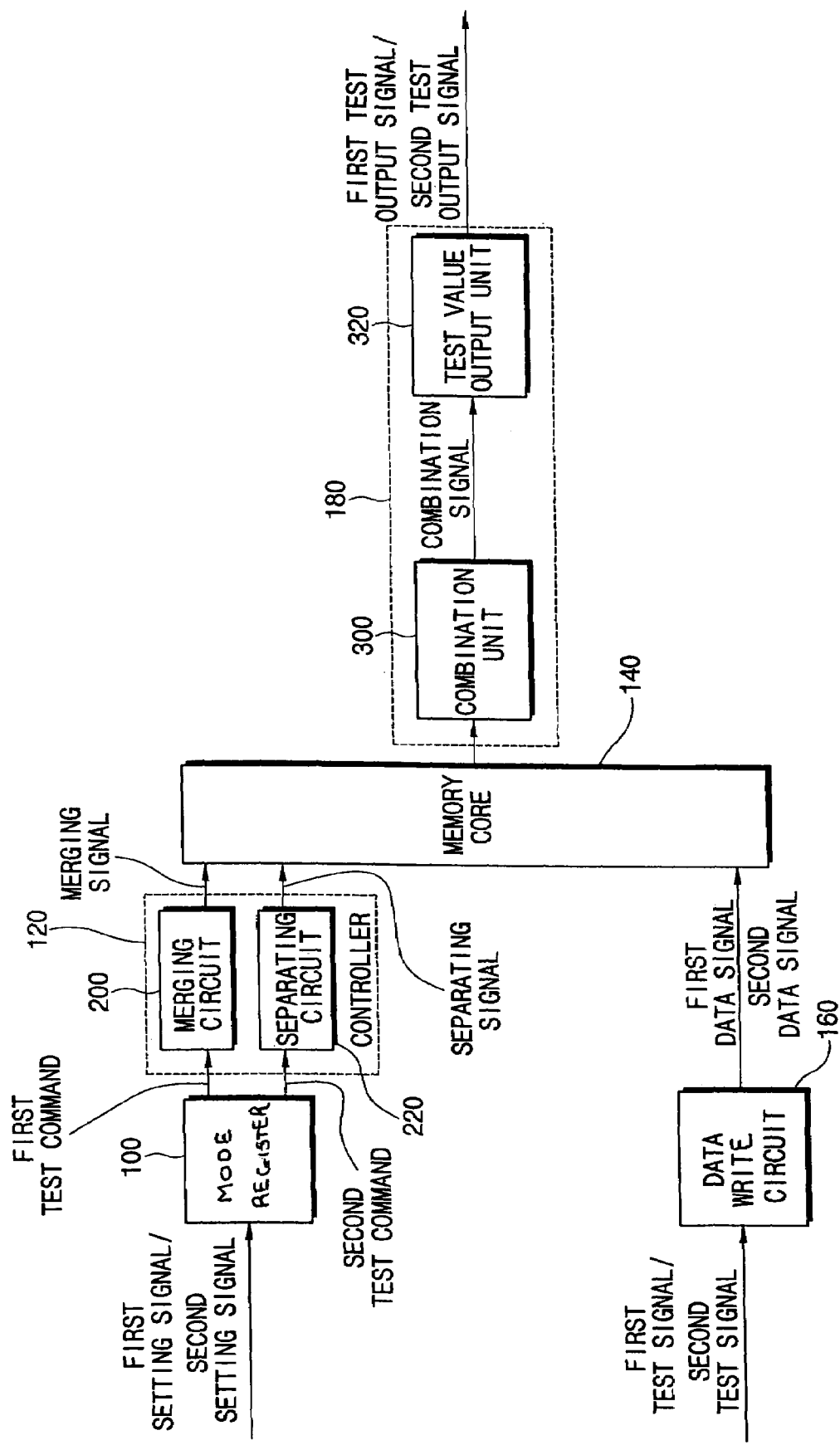

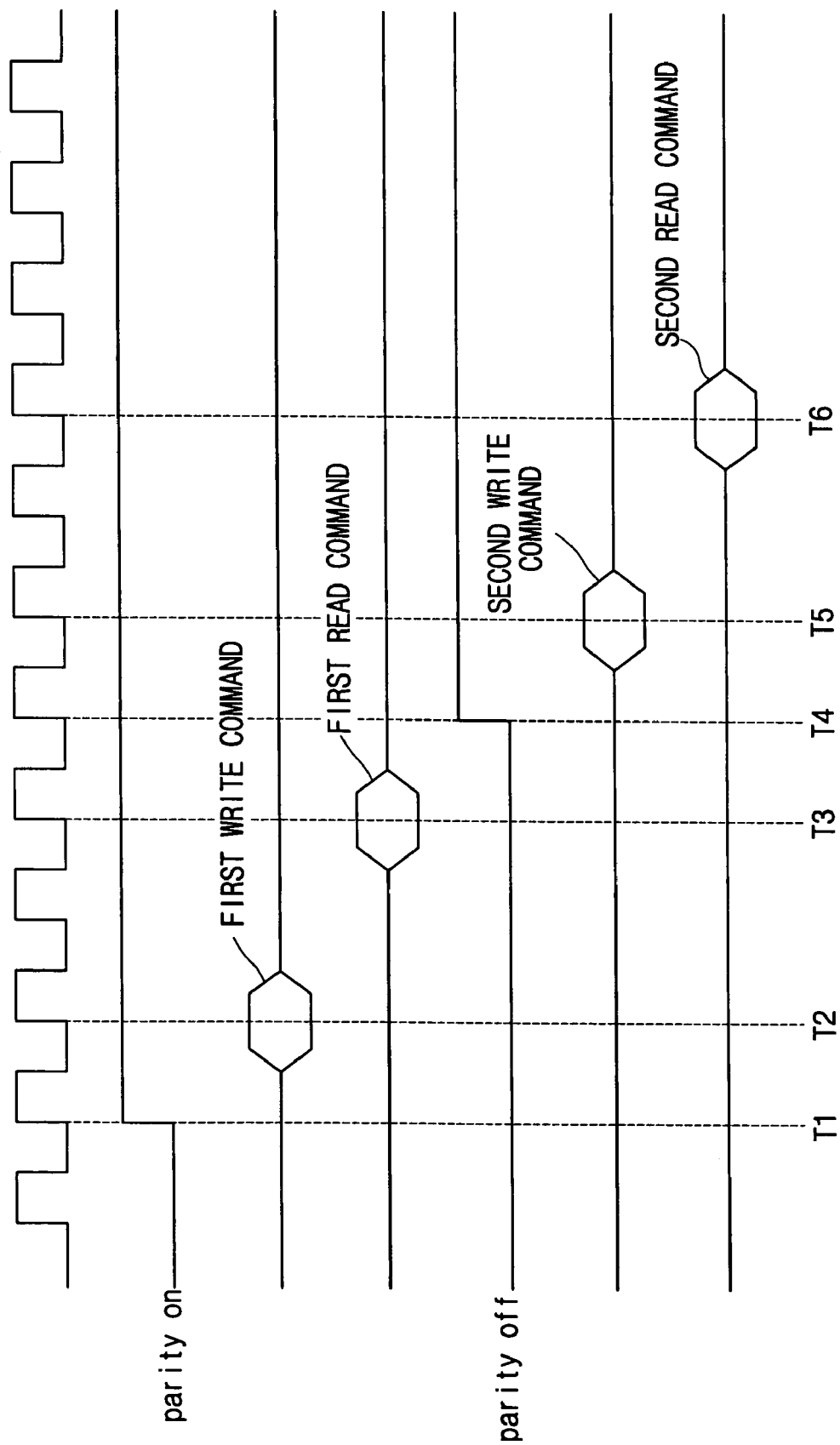

METHOD AND APPARATUS FOR TESTING SEMICONDUCTOR MEMORY DEVICE AND RELATED TESTING METHODS

BACKGROUND OF THE INVENTION

1. Field of the Invention

The present invention relates generally to a method and apparatus for testing a semiconductor memory device. The present invention also related to a semiconductor memory device adapted to testing in a reduced testing time.

A claim to priority is made to Korean Patent Application No. 2003-88677 filed on Dec. 8, 2003, the subject matter of which is incorporated by reference.

2. Description of the Related Art

The typical apparatus for testing a semiconductor memory device incorporates several different methods to test for various failures in the device. One test method commonly run is the parallel bit test (PBT). The PBT tests a plurality of memory cells using only a small number of data pins. A conventional semiconductor memory device typically includes an even number of memory cells on every column, and an even number of data pins. Thus, conventional methods for testing such a semiconductor memory device expect to see a plurality of memory cells having an even number of data pins.

However, these conventional test methods cannot be applied to a network of Dynamic Random Access Memory (DRAM) because the DRAM typically include at least some memory cells storing parity information. As a result, the apparatus conventionally used to test a semiconductor memory device included in a network of DRAM require additional data pins, and generally use an odd number of data pins.

Additionally, the time required to test conventional semiconductor memory devices tends to rise as the number of data pins on the devices increases. Given the trend towards higher pin counts, the duration of certain test times is becoming an issue. In sum, the conventional apparatuses and methods applied to the testing of semiconductor memory devices result in unacceptably long test times. Test times must be further reduced without increasing or otherwise altering the then number of data pins associated with the semiconductor memory devices.

SUMMARY OF THE INVENTION

The present invention addresses the issue of accessing disparately numbered (e.g., odd and even) bits lines or combinations of bits lines to expedite semiconductor memory device testing. A sequence of programmable test modes is applied to the semiconductor memory device, each mode variously accessing a different combination of bit lines.

Thus, in one aspect the present invention provides a method of testing a semiconductor memory device. The method comprises; programming a test apparatus with a first test mode, merging predetermined bit lines associated with the semiconductor memory device, writing first test data associated with the first test mode to memory cells in the semiconductor memory device via bit lines including the merged bit lines, reading the first test data from the memory cells, combining the first test data read from the memory cells to generate a first test output signal having a first test output value, and comparing the first test output value to a first expected value to generate a first error detection signal.

Thereafter, the method further comprises; programming the test apparatus with a second test mode, separating the merged bit lines, writing second test data associated with the second test mode to the memory cells, reading the second test data from the memory cells, combining the second test data read from the memory cells to generate a second test output signal having a second test output value, and comparing the second test output value with a second expected value to generate a second error detection signal.

In yet another related aspect, the present invention provides a method of testing a semiconductor memory device, comprising; programming an apparatus for testing the semiconductor memory device with a first test mode, merging predetermined bit lines associated with the semiconductor memory device, writing first test data associated with the first test mode to memory cells in the semiconductor memory device via bit lines including the merged bit lines, reading the first test data from the memory cells, logically combining the first test data read from the memory cells to generate first combination data, logically combining the first combination data to generate second combination data, comparing the second combination data to generate a first test output value, and comparing the first test output value with a first expected value to generate a first error detection signal.

The method thereafter further comprises; programming the apparatus for testing the semiconductor memory device with a second test mode, separating the merged bit lines, writing second test data associated with the second test mode to the memory cells via bit lines excepting at least one of the formerly merged bit lines, reading the second test data from the memory cells, logically combining the second test data to generate third combination data, logically combining the third combination data to generate fourth combination data, comparing the fourth combination data to generate a second test output value, and comparing the second test output value with a second expected value to generate a second error detection.

In another aspect, the present invention provides a semiconductor memory device, comprising; a memory core comprising a plurality of memory cells and a plurality of bit lines corresponding to the plurality of memory cells, a data write circuit writing test data to the plurality of memory cell in response to a test signal, the test signal being provided from an apparatus for testing the semiconductor memory device, a Mode Register generating a test command to set a test mode in response to a setting signal provided from the apparatus for testing the semiconductor memory device, a controller establishing a variable test connection for the plurality of bit lines in response to the test command, and an output circuit reading the test data from the plurality of memory cells, and logically combining the test data to generate a test output signal having a test output value.

In yet another aspect, the present invention provides a semiconductor memory device, comprising; a memory core comprising a plurality of memory cells and a plurality of bit lines corresponding to the plurality of memory cells, a data write circuit sequentially writing first test data related to a first test signal and second test data related to a second test signal to the plurality of memory cells, wherein the first and second test signals are provided to the semiconductor memory device from a test apparatus, an Mode Register generating first and second test commands, the first and second test commands respectively setting first and second test modes by first and second setting signals provided from the test apparatus, a controller merging bit lines selected from the plurality of bit lines in response to the first test command, and separating the merged bit lines in response to the second test command, and an output circuit reading the first and second test data from the plurality of memory cells, logically combining the first test data to generate a first test output signal having a first test output value, and logically combining the second test data to generate a second test output signal having a second test output value.

In still another aspect, the present invention provides an apparatus for testing a semiconductor memory device, comprising; a programming circuit for programming the semiconductor memory device in relation to one of a plurality of test modes, a setting circuit merging a plurality of bit lines associated with the semiconductor memory device in response to programming a first test mode and thereafter separating the merged bit lines in response to programming a second test mode, a signal providing circuit generating a test signal having test data defined in accordance with each one of the plurality of test modes, a signal receiving circuit receiving the test output signal having a test output value generated in accordance with one of the plurality of test modes, and an error detecting circuit comparing the test output value with a predefined expected value to generate an error detection signal.

In a related aspect, the present invention provides an apparatus for testing a semiconductor memory device, comprising; a programming circuit sequentially programming the semiconductor memory device in first and second test modes, a setting circuit generating a first setting signal adapted to merge a plurality of bit lines associated with the semiconductor memory device in response to the first test mode and a second setting signal adapted to separate the merged bit lines in response to the second test mode, a transmitter generating a first test signal having first test data in response to the first test mode and a second test signal having second test data in response to the second test mode, a receiver receiving first and second test output signals having respectively first and second test output values generated in response to testing the semiconductor memory device in the first and second test modes, and an error detection circuit comparing the first and second test output values with predefined first and second expected values to generate first and second error detection signals.

BRIEF DESCRIPTION OF THE DRAWINGS

The above and other advantages associated with the present invention will become more apparent upon consideration of certain exemplary embodiments of the present invention with reference to the accompanying drawings, in which:

FIG. 2 is a block diagram showing a semiconductor memory device according to an exemplary embodiment of the present invention;

FIG. 4 is a timing diagram illustrating an operation of testing a semiconductor memory device according to an exemplary embodiment of the present invention;

DESCRIPTION OF THE EXEMPLARY EMBODIMENTS

Exemplary embodiments of the present invention are set forth below with reference to the accompanying drawings.

Figure 1:
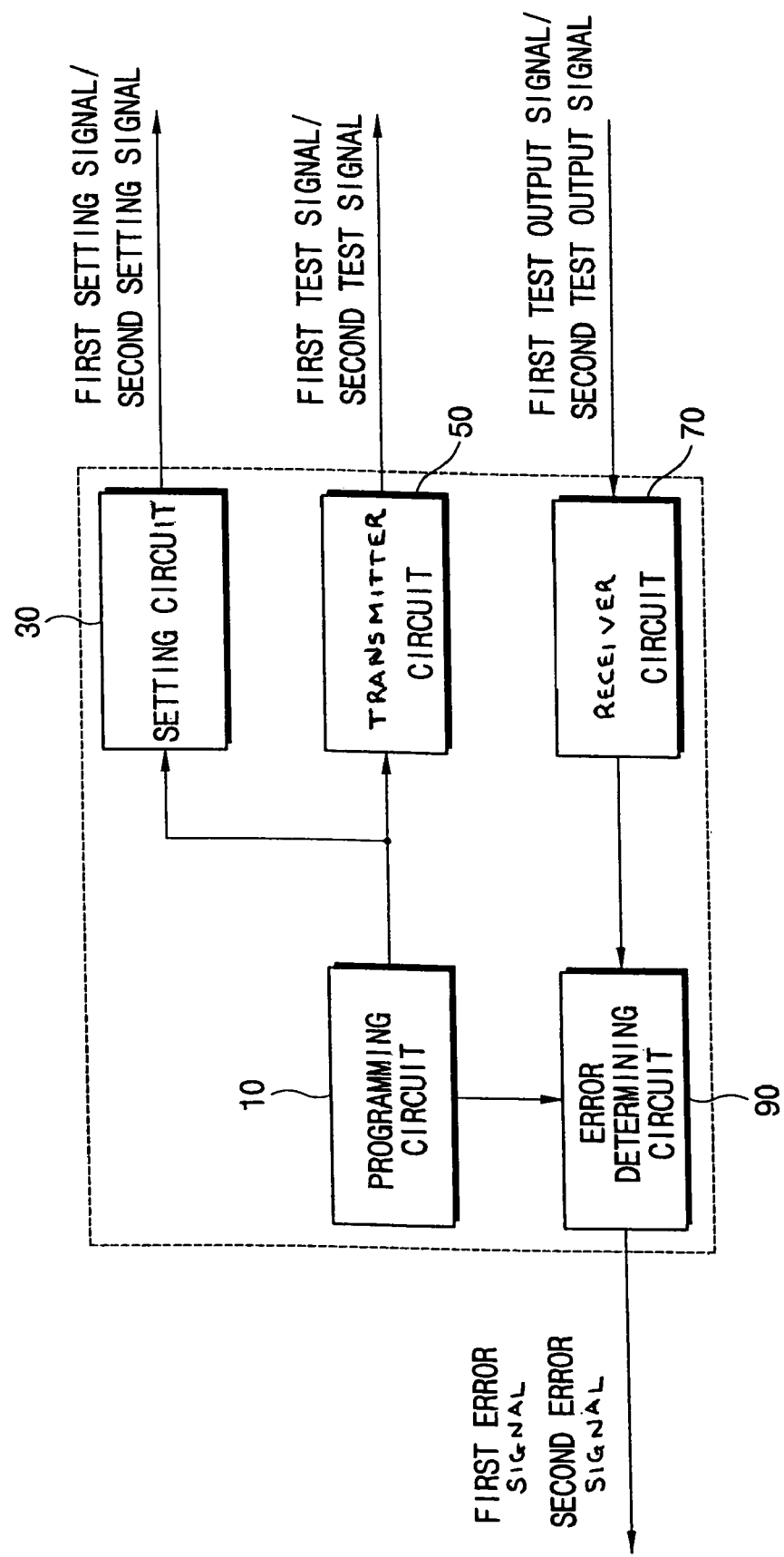
FIG. 1 is a block diagram showing an apparatus for testing a semiconductor memory device according to an exemplary embodiment of the present invention.

FIG. 1 is a block diagram showing an apparatus for testing semiconductor memory device according to one exemplary embodiment of the present invention. Referring to FIG. 1, the apparatus for testing semiconductor memory device generally comprises a programming circuit 10, a setting circuit 30, a transmitter circuit 50, a receiver circuit 70, and an error detection circuit 90.

Programming circuit 10 is adapted to program a related test apparatus in a first test mode and/or a second test mode. More specifically, programming circuit 10 first programs the test apparatus in the first test mode, and thereafter performs a test in the first test mode. After waiting a predetermined period following execution of the first test mode, programming circuit 10 re-programs the test apparatus in the second test mode, and the thereafter performs another test in the second test mode. In this manner, multiple sequential tests may be run on the semiconductor memory device being tested. As part of this programmed sequence of test, programming circuit 10 sets first and second expected values that correspond to the first and second test modes, respectively. Each expected value is a specific value or a range of values indicating a normal test result for the semiconductor memory device.

Setting circuit 30 preferably generates a first setting signal. The first setting signal effectively merges a predetermined plurality of bit lines on the semiconductor memory device for access during the first test mode. Setting circuit 30 also preferably generates a second setting signal which effectively separates the plurality of bit lines for access during the second test mode. The first and second setting signals are respectively provided to the semiconductor memory device for the purpose of each corresponding test.

Transmitter 50 generates a first test signal communicating first test data during the first test mode. Transmitter 50 also generates a second test signal communicating second test data during the second test mode. The first and second test signals are respectively provided to the semiconductor memory device for the purpose of each corresponding test.

Receiver 70 receives first and second test output signals that respectively have first and second test output values from the semiconductor memory device. This aspect of the present invention is described in some additional detail hereafter.

Error detection circuit 90 compares the first expected value with the first test output value to generate a first error signal.

Error detection circuit 90 also compares the second expected value with the second test output value to generate a second error signal. Failure of the semiconductor memory device during the first and/or the second test is preferably determined in accordance with the foregoing comparisons.

FIG. 2 is a block diagram showing the semiconductor memory device adapted to the test method and related apparatus described above. Referring to FIG. 2, the semiconductor memory device preferably comprises a mode register (MRS) 100, a controller 120, a memory core (or memory cell array) 140, a data write circuit 160, and an output circuit 180.

Memory core 140 generally includes a plurality of memory banks. The apparatus for testing the semiconductor memory device according to the present invention preferably tests these banks in sequence. The banks include first bit lines corresponding to data bit lines and a second bit line corresponding to a parity bit. In many cases, memory core 140 further comprises a second bit line per each column where the semiconductor memory device is intended for use as a network memory. During one common test, test data is stored in memory cells corresponding to the bit lines.

During this first test, the second bit line is merged with one or more of the data bit lines for access during the first test mode. Following the first test, the merged bit lines are separated for access during the second test mode.

MRS circuit 100 receives the first setting signal and in response generates a first test command for merging the bit lines. MRS circuit 100 also receives the second setting signal and in response generates a second test command for separating the bit lines.

Controller 120 preferably includes a merging circuit 200 and a separating circuit 220. The term "merging" generally means any technique or resulting circuit connection, whereby two or more otherwise separate signal lines (e.g., bit lines) are electrically connected to receive the same data input. In this context, the term "separating" means returning previously merged signal lines to their electrically separate states in order to independently receive data input(s).

Merging circuit 200 merges the second bit line with a predetermined number of first bit lines in response to the first test command. As a result, the same data is written via the merged bit lines to the corresponding of memory cells.

Separating circuit 220 separates the merged bit lines in response to the second test command. As a result, different data may be written via the separated bit lines to the corresponding memory cells.

Within the context of the first test mode and in response to the first test signal received from the test apparatus, data write circuit 160 writes the first test data to memory core 140. Within the context of the second test mode and in response to the second test signal, data write circuit 160 writes the second test data to the memory core 140. In one preferred and more specific embodiment, a $\overline{WI}$ signal is activated in response to a "low" (i.e., an indicated level for a logical low value) $\overline{CAS}$ signal. Then, a low $\overline{RAS}$ signal is input. As a result of these signals, data writing circuit 160 is able to respectively write the first and second test data to the memory cells using the corresponding bit lines of memory core 140.

The output circuit 180 preferably includes a combination unit 300 and a test value output unit 320.

Combination unit 300 reads the first and second test data from memory core 140 and combines the first and second test data to generate one or more combination signals. More specifically, combination unit 300 preferably combines the first test data resulting from the first test mode and generates a corresponding first combination signal. In addition, combination unit 300 preferably combines the second test data resulting from the second test mode to generate a second combination signal.

Test value output unit 320 generates a first output signal having a first test output value in accordance with the first combination signal. In addition, test value output unit 320 generates a second output signal having a second test output value in accordance with the second combination signal. The apparatus for testing the semiconductor memory device determines whether the semiconductor memory device has failed the first or second test mode by comparing the first test output value with a first expected value and by comparing the second test output value with a second expected value.

Figure 3A:
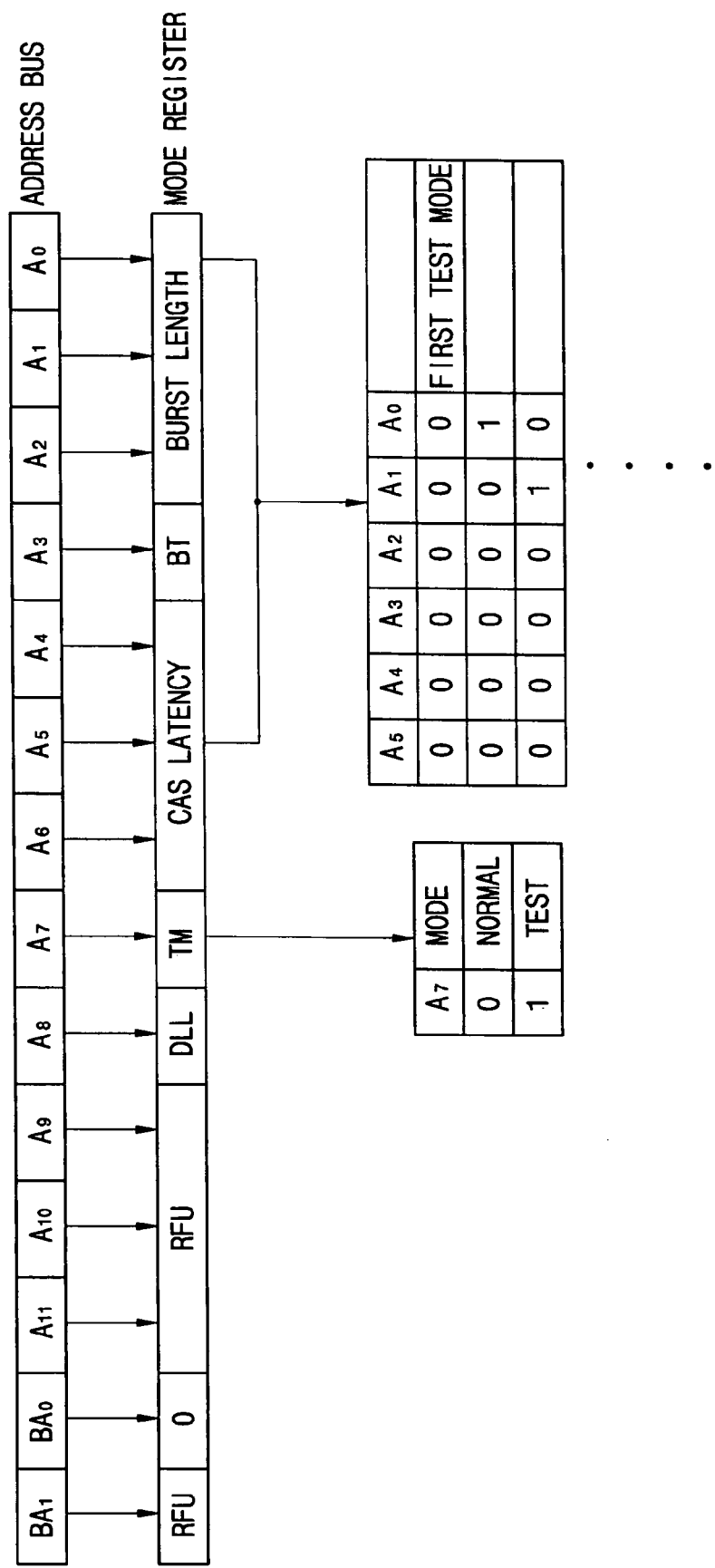
FIG. 3A is a block diagram illustrating an operation of generating a first test command in accordance with an exemplary embodiment of the present invention.

FIG. 3A is a block diagram illustrating a method for generating the first test command in accordance with the exemplary embodiment of the present invention described in relation to FIGS. 1 and 2.

In the working example, MRS circuit 100 generates a first test command in accordance with the first setting signal transmitted through an address bus. With reference to FIG. 3, if the value of $A_7$ is "0", MRS circuit 100 generates a first normal command indicating execution of a general operation applied to a regular DRAM. On the other hand, if the value of $A_7$ is "1", MRS circuit 100 generates a test command indicating execution of a test operation. Thus, MRS circuit 100 generates a plurality of test commands using codes derived from combinations of address bits $A_0$ through $A_5$. For example, if the code combination of $A_0$ through $A_5$ is "000000", MRS circuit 100 generates a first test command corresponding to the first test mode. MRS circuit 100 may generate the first test command in response to a plurality of codes generated by various combinations of $A_0$ through $A_6$. Indeed, those of ordinary skill in the art will recognize that various test commands may be generated from numerous code combinations derived from the values represented bits $A_0$ through $BA_1$.

Figure 3B:
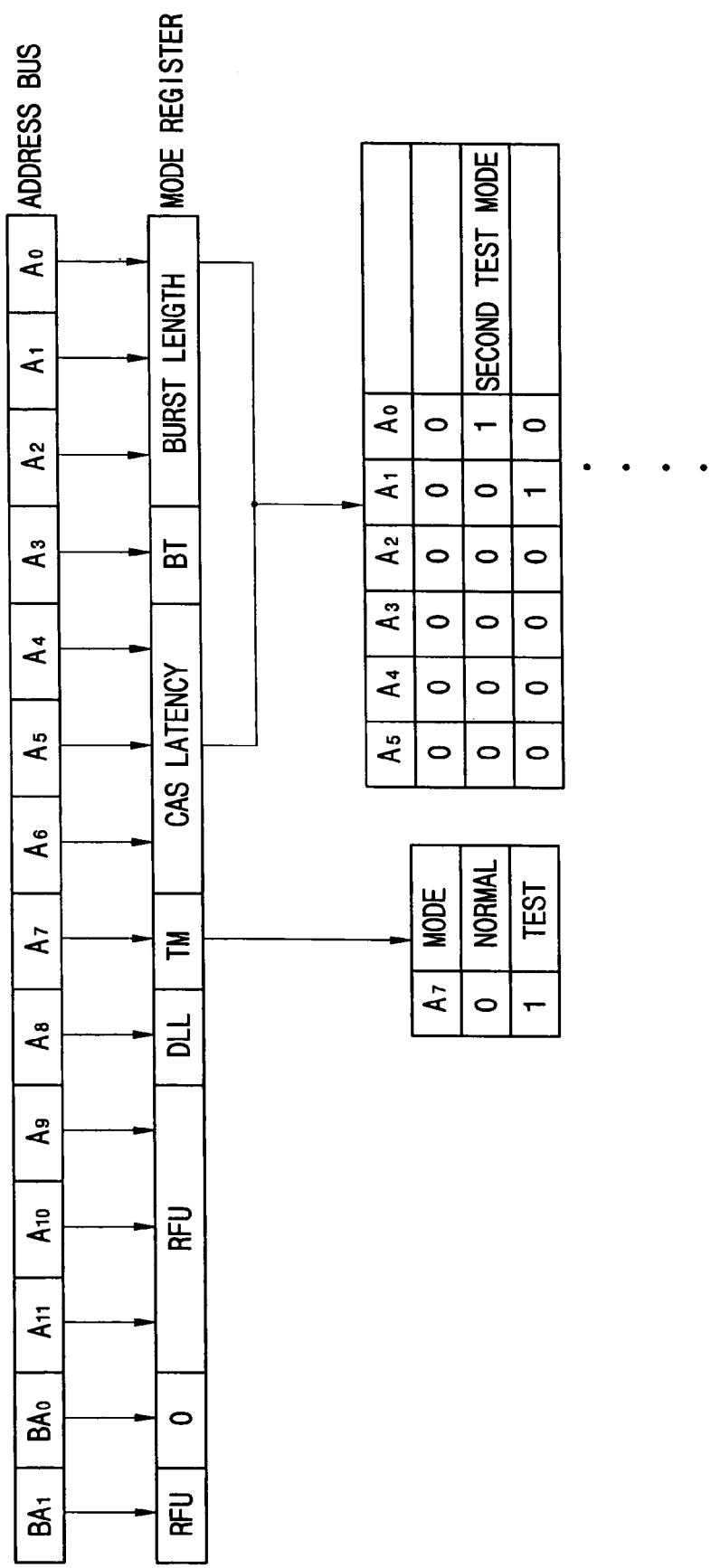
FIG. 3B is a block diagram illustrating an operation of a second test command according to an exemplary embodiment of the present invention.

FIG. 3B is a block diagram illustrating a method for generating a second test command using the current working example as descriptive context.

Referring to FIG. 3B, MRS circuit 100 generates the second test command using the second setting signal received through the address bus. When the value of $A_7$ is "0", for example, MRS circuit 100 generates a second normal command indicating execution of a general operation applied to a regular DRAM. On the other hand, when the value of $A_7$ is "1", MRS circuit 100 generates a test command indicating execution of a test operation. In similar fashion as above, MRS circuit 100 is adapted to generate a plurality of test commands using codes that are based on combinations derived from the value of $A_0$ through $A_5$. If the code combination of $A_0$ to $A_5$ is "000001", for example, MRS circuit 100 generates a second test command corresponding to the second test mode.

Figure 3C:
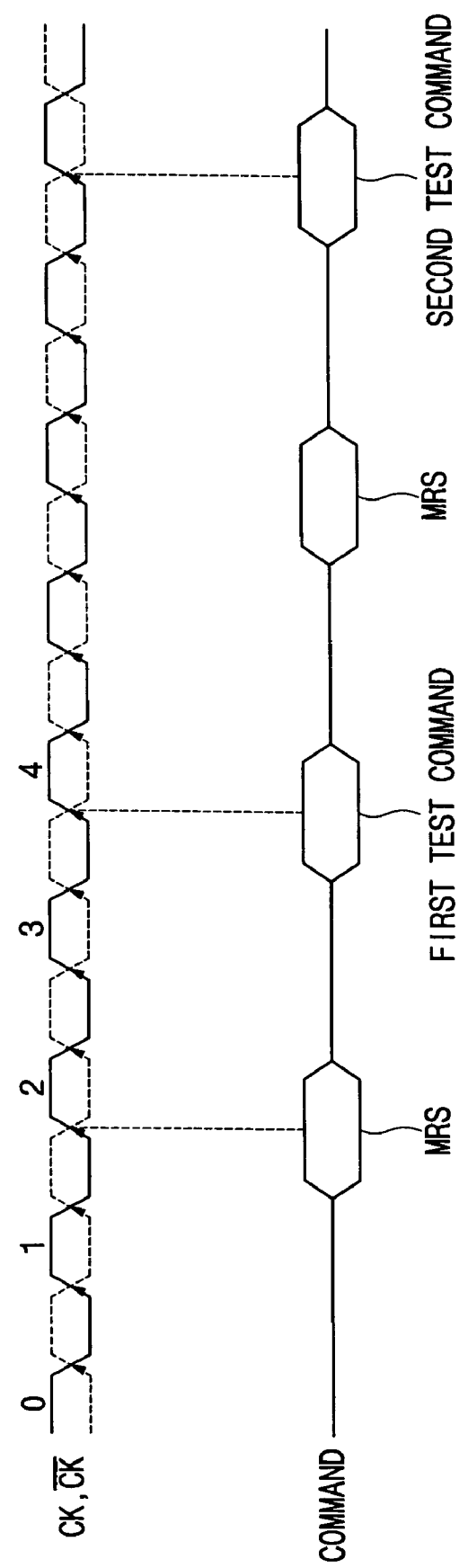
FIG. 3C is a timing diagram illustrating a generation of a test commands according to an exemplary embodiment of the present invention.

FIG. 3C is a timing diagram further illustrating the sequence of test command generation. In FIG. 3C, the first test command is generated after the first setting signal is input to MRS circuit 100. Then, the second test command is generated after the second setting signal is input to MRS circuit 100.

FIG. 4 is a timing diagram generally illustrating the sequence of testing for a semiconductor memory device according to an exemplary embodiment of the present invention.

Referring to FIG. 4, at time T1, second bit line is merged with a predetermined number of first bit lines in relation to the first test command. Thereafter, at time T2, a first write command is generated. As a result, the first test data is written to memory cells corresponding to the merged bit lines. At time T3, a first read command is generated, and the first test data previously written to the memory cells corresponding to the merged bit lines is read. The first test data read from the memory cells is combined to form the first test output value.

At time T4, however, the merged bit lines are separated in relation to the second test command. Thus, different data may be written to the separated subsets (e.g., first bit lines verses the second bit line) of the once merged bit lines. Thereafter, at time T5, a second write command is generated. As a result, the second test data may be written to memory cells corresponding to the first bit lines, but not the memory cells corresponding to the second bit line. In this manner, the memory cells corresponding to the second bit line are able to maintain their previous test data value. At time T6, a second read command is generated. As a result, the second test data written to the memory cells is read. The second test data is thereafter combined to form the second test output value.

Figure 5:
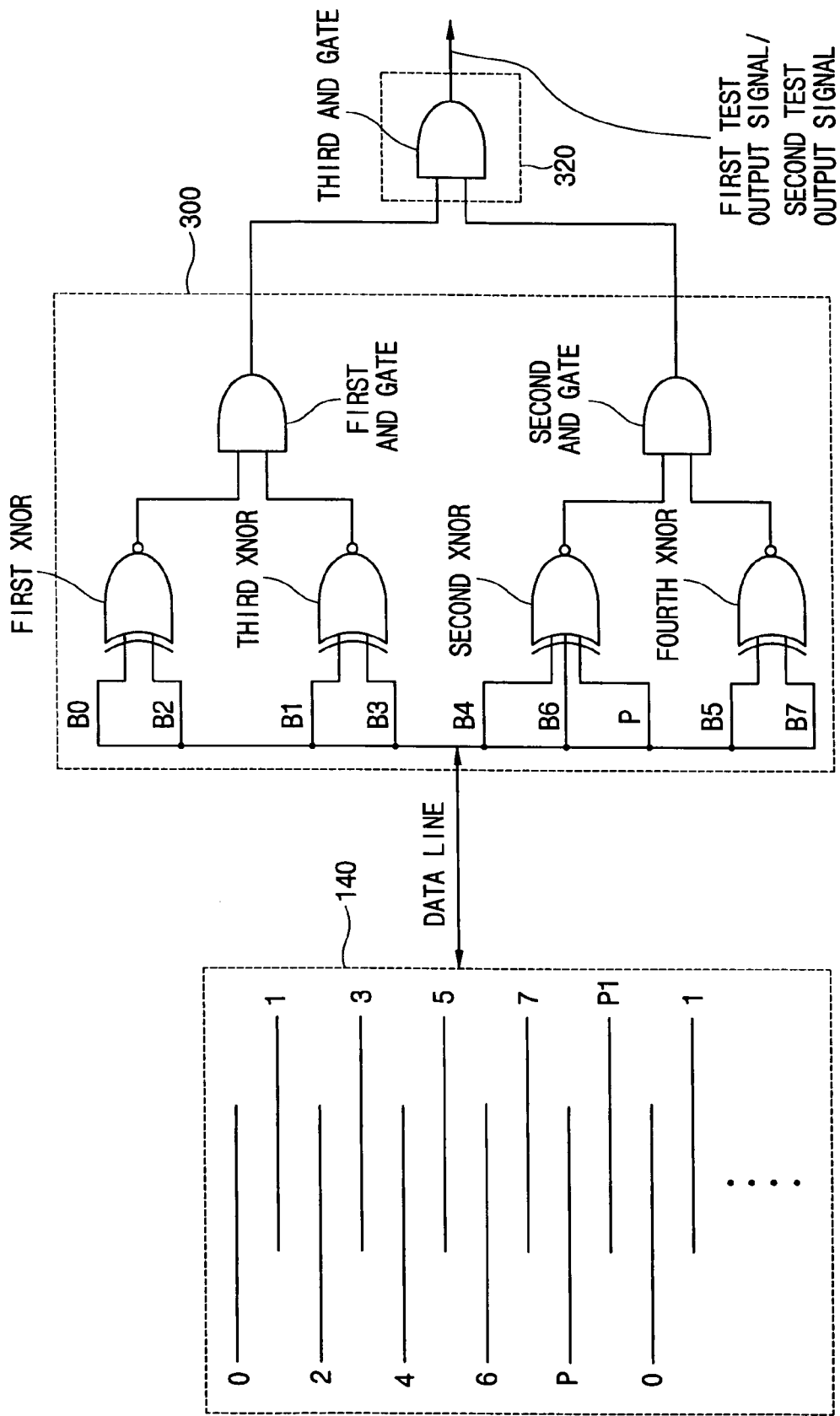
FIG. 5 is a circuit diagram showing an output circuit in x8 memory device according to an exemplary embodiment of the present invention.

FIG. 5 is a circuit diagram showing an output circuit for an exemplary 8-bit memory device operating in conjunction with the combination unit 300 of FIG. 2. This example will be used to further describe several related aspects of the present invention.

Referring to FIG. 5, combination unit 300 preferably comprises a first exclusive NOR (XNOR) gate, a second XNOR gate, a third XNOR gate, a fourth XNOR gate, a first AND gate, and a second AND gate.

The first XNOR gate receives data read from two first bit lines, B0 and B2 through the data lines at every column using X address and Y address. For instance, in case of column 0, the first XNOR gate receives data read from bit lines B0 and B2.

The second XNOR gate corresponds to two first bit lines, B4 and B6, and the second bit line P. More specifically, the second XNOR gate receives data read from bit lines B4 and B6, as well as bit line P through the data lines at every column using X address and Y address.

The third XNOR gate receives data read from two first bit lines, B1 and B3, through the data lines at every column using X address and Y address, and the fourth XNOR gate receives data read from two first bit lines, B5 and B7, through the data lines at every column using X address and Y address.

The first AND gate is coupled to the outputs of the first and third XNOR gates, and the second AND gate is coupled to outputs of the second and fourth XNOR gates.

The test value output circuit 320 preferably comprises a third AND gate, where the third AND gate is coupled to outputs of the first and second AND gates.

Figure 6:
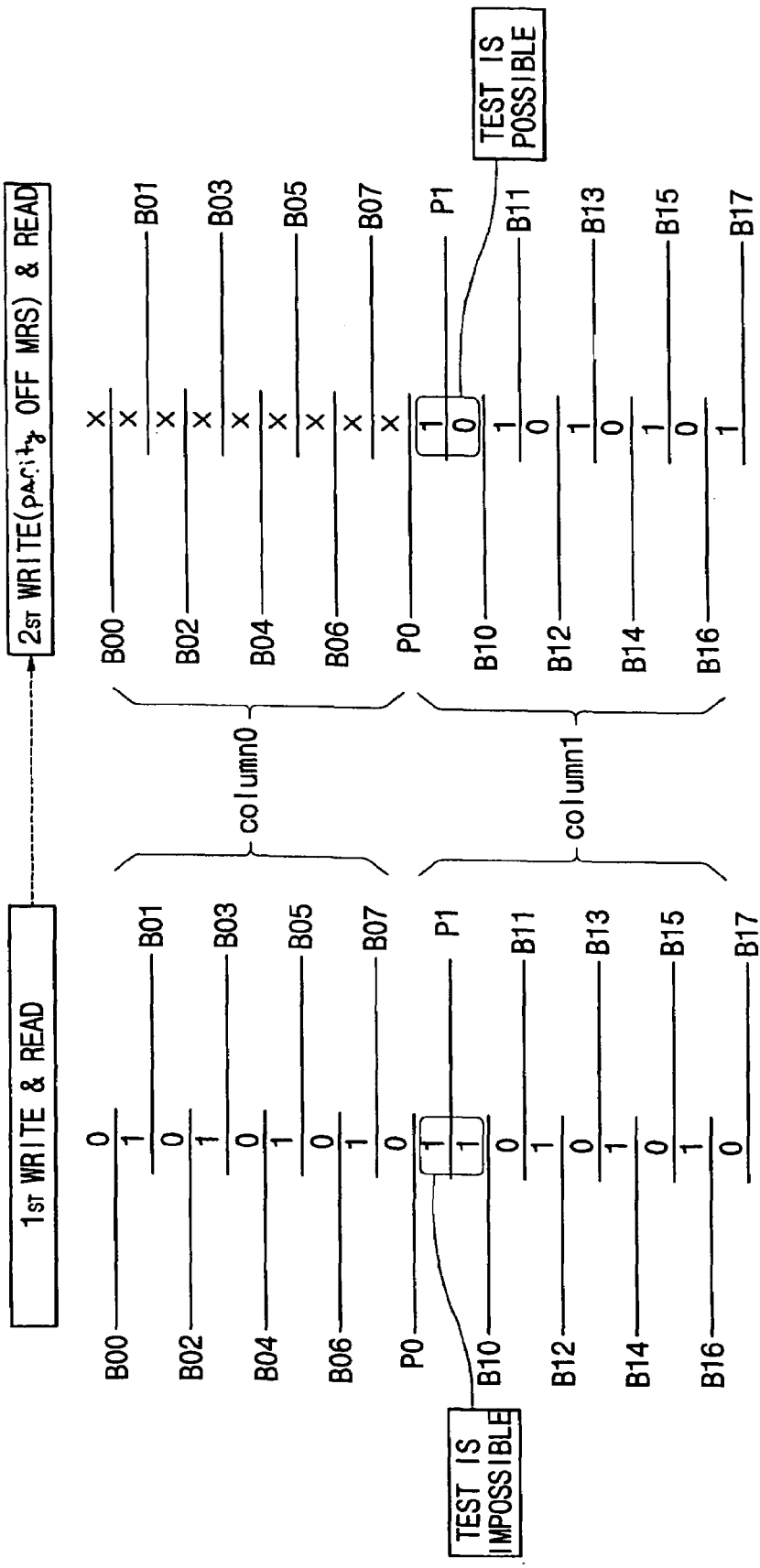
FIG. 6 illustrates an operation of testing adjacent bit lines of the x8 memory device according to an exemplary embodiment of the present invention.

FIG. 6 further illustrates the testing of adjacent bit lines in the exemplary 8-bit memory device.

Referring to FIGS. 5 and 6, predetermined test data is written to the memory cells corresponding to the bit lines of columns B0 and B1. In the working example it is further assumed that bit lines B06 and B16 are respectively merged with bit lines P0 and P1 that correspond to parity bits. Further, logical values of "0" and "1." are alternately written to the bit lines associated with column 0, while logical values of "1" and "0" are alternately written to the bit lines associated with column 1.

The testing of a normally functioning semiconductor memory device will now be described in relation to the working example.

Test data values for bit lines B00 and B02 are input to the first XNOR gate. Since the test data values for bit lines B00 and B02 are equal to each other, an output value for the first XNOR gate is "1".

Test data values for bit lines B04 and B06 and parity bit line P0 are input to the first XNOR gate. Since the test data values for bit lines B04, B06 and P0 are equal to each other, an output value of the second XNOR gate is "1".

Test data values for bit lines B05 and B07 are input to the fourth XNOR gate. Since the test data values for bit lines B05 and B07 are equal to each other, an output value of the fourth XNOR gate is "1".

Since output values for the first and third XNOR gates are "1", an output of the first AND gate is "1". Similarly, since output values for the second and fourth XNOR gates are "1", an output of the second AND gate is "1".

Since output values for the first and second AND gates are both "1", an output value of the third AND gate is "1". This value is the first expected value.

The testing of an abnormally functioning (in error) semiconductor memory device will now be described.

For instance, assuming bit lines B01 and B02 are electrically shorted, the test data values for bit lines B01 and B02 become equal to each other. As a result, all of the test data values for bit lines B01 and B02 become "0" or "1". If all of the test data values for bit lines B01 and B02 are "0", the output value of the third XNOR gate becomes "0". Thus, the output value of the third AND gate becomes "0", and the output value of the third AND gate is equal to the first test output value. If all the test data values for bit lines B01 and B02 are "1", the output value of the first XNOR gate becomes "0". Thus, the output value of the third AND gate becomes "0", and, therefore, the first test output value is "0", thus indicating an error has occurred in the testing of adjacent bit lines.

The apparatus for testing the semiconductor memory device according to the present invention compares the first expected value and the first test output value. Since the first expected value is different from the first test output value, an error is detected for the semiconductor memory device being tested.

Operation of testing bit lines B10 to B17 corresponding to column 1 is the same as that of testing the bit lines corresponding to the column 0.

However, if the bit lines B10 and P1 are electrically shorted, an effective test becomes impossible. This results arises since parity bit line P1 is merged with the bit line B16, and a value of "1" is written via both the bit lines P1 and B10. Thus, even when the bit lines B10 and P1 are electrically shorted, both the bit lines B10 and P1 become "1". Therefore, it is impossible to test whether the bit lines B10 and P1 are electrically shorted. However, the apparatus for testing the semiconductor memory device according to the present invention subsequently tests the semiconductor according to the second test mode.

Test data values are again written to the bit lines according to the second test mode after bit lines B16 and P1 have been separated. In other words, the second test mode allows different test data to be written to bit lines B16 and P1.

In some additional detail, different test data is written via the bit line B16 during the second test mode while no data is written via the bit line P1. In other words, the bit line P1 retains the data previously written. Thus, if bit lines B16 and P1 are electrically shorted, equal logic values will be written via the bit lines B16 and P1. As a result—as can be seen from working these values through the foregoing example—the second test output value becomes "0" which differs from the second expected value is "1". Since the second expected value and the second test output value are different, the apparatus for testing the semiconductor memory device detects an error. In FIG. 6, the "X" value denotes a "don't care" condition.

Figure 7:
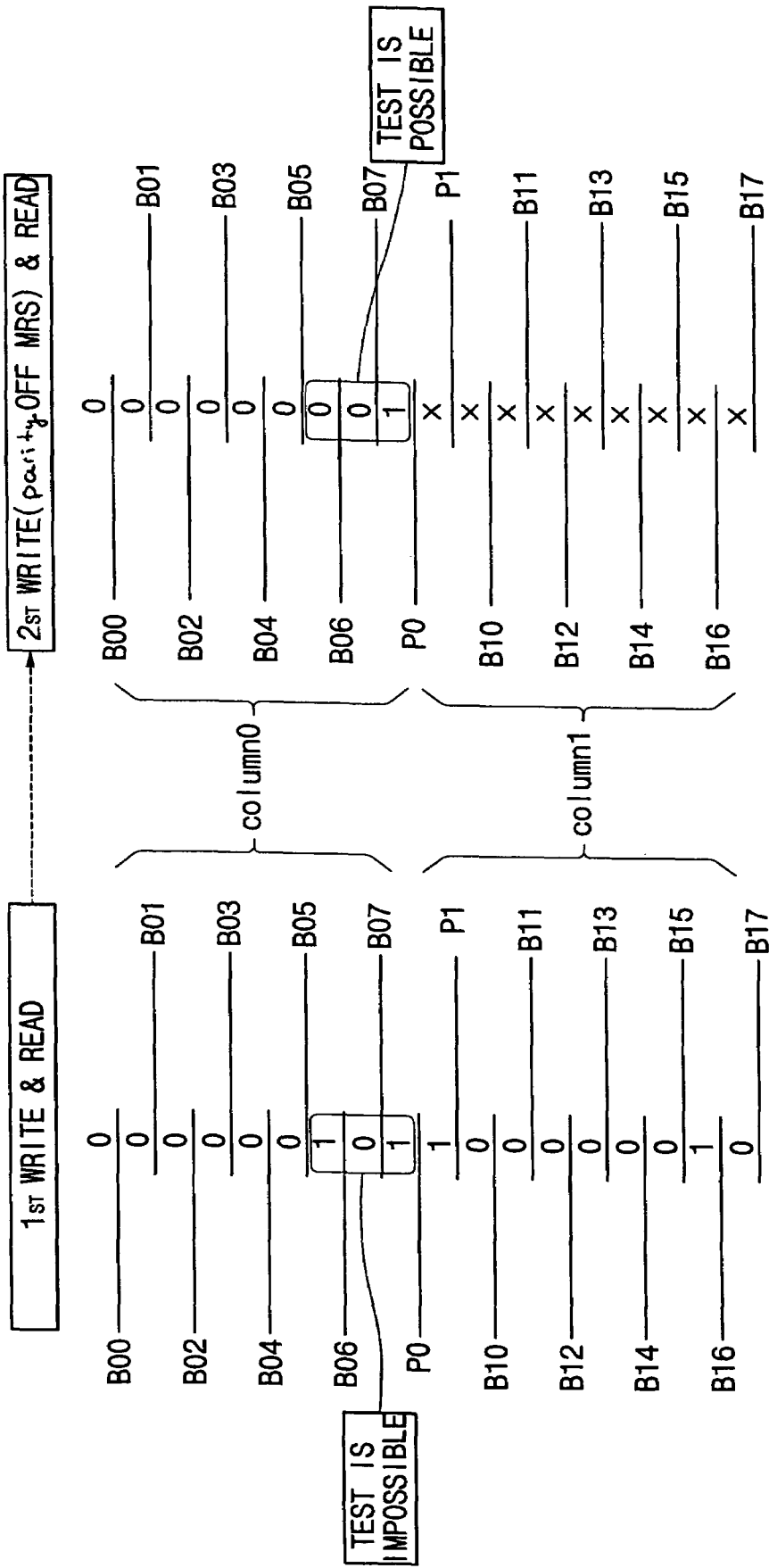
FIG. 7 illustrates an operation of testing non-adjacent bit lines of the x8 memory device according to an exemplary embodiment of the present invention.

FIG. 7 illustrates the testing of non-adjacent bit lines in an exemplary 8-bit memory device.

Referring now to FIGS. 5 and 7, predetermined test data are written to the memory cells corresponding to the bit lines of columns 0 and 1. Bit lines B06 and B16 are respectively first merged with bit lines P0 and P1 corresponding to parity bits.

Tests results for a normally operating semiconductor memory device are first described.

Test data values for bit lines B00 and B02 are input to the first XNOR gate. Since the test data values for bit lines B00 and B02 are equal, an output value for the first XNOR gate is "1".

Test data values for bit lines B04 and B06, as well as bit line P0 are input to the second XNOR gate. Since the test data values of the bit lines B04, B06 and P0 are not equal to each other, an output value of the second XNOR gate is "0".

Test data values for bit lines B01 and B03 are input to the third XNOR gate. Since the test data values of the bit lines B01 and B03 are equal, an output value for the third XNOR gate is "1".

Test data values for bit lines B05 and B07 are input to the fourth XNOR gate. Since the test data values for the bit lines B05 and B07 are equal, an output value for the fourth XNOR gate is "1".

Since the output values for the first and third XNOR gates are "1", an output for the first AND gate is "1".

Since the output values for the second and fourth XNOR gates are respectively "0" and "1", an output for the second AND gate is "0".

Since the output values for the first and second AND gates are respectively "1" and "0", an output value for the third AND gate is "0". The output value for the third AND gate is the first expected value.

Test results for an abnormally functioning (in error) memory device will now be described.

For instance, assuming bit lines B04 and B06 are electrically shorted, the test data values for bit lines B04 and B06 become equal. As a result, all the test data values for bit lines B04 and B06 become "0" or "1". In addition, since bit line B06 is merged with the parity bit line P0, all test data values for bit lines B04, B06 and P0 are "0" or "1". When all the test data values for bit lines B04, B06 and P0 are "0", the output value of the second XNOR gate becomes "1". Thus, the output value for the third AND gate becomes "1". The output value for the third AND gate is the first test output value. If all the test data values for the bit lines B06 and P0 are "1", the output value of the second XNOR gate becomes "0". Thus, the output value of the third AND gate becomes "1". Thus, the first test output value is "1".

The apparatus for testing the semiconductor memory device compares the first expected value and the first test output value. Since the first expected value is different from the first test output value, an error is detected in the semiconductor memory device.

The testing of bit lines B10 to B17 corresponding to the column 1 is the same as that of testing the bit lines corresponding to the column 0.

However, where bit lines B16 and P1 are shorted, the test is impossible. This result arises because bit line B16 is merged with the parity bit line P1, and a logical value of "1" is written to memory cells corresponding to both bit lines B16 and P1. Therefore, it is impossible for the first test mode to determine whether the bit lines B16 and P1 are electrically shorted. Accordingly, the apparatus for testing the semiconductor memory device tests the semiconductor according in the second test mode.

Test data values are again written via the bit lines according to the second test mode after bit lines B16 and P1 have been separated. As a result, different test data is able to be written via the bit lines B16 and P1. Different test data is written via bit line B16 during the second test mode, while no data is written via the parity bit line P1. Memory cells corresponding to parity bit line P1 thus retain their previously written test data values.

Accordingly, where bit lines B16 and P1 are electrically shorted, the same logical value "0" is written via both bit lines B16 and P1, and the second test output value becomes "1". Yet, the second expected value is "0". Since the second expected value and the second test output value are different from each other, an error is indicated for the semiconductor memory device. As with FIG. 6, the values "X" in FIG. 7 denote "don't care" conditions.

In a related aspect, the apparatus for testing semiconductor memory devices according to the present invention is well adapted to run a large number of test patterns. The plurality of potential test patterns ensure that a variety of different semiconductor memory devices (e.g., devices having various bit line layouts) can be accurately tested.

Figure 8:
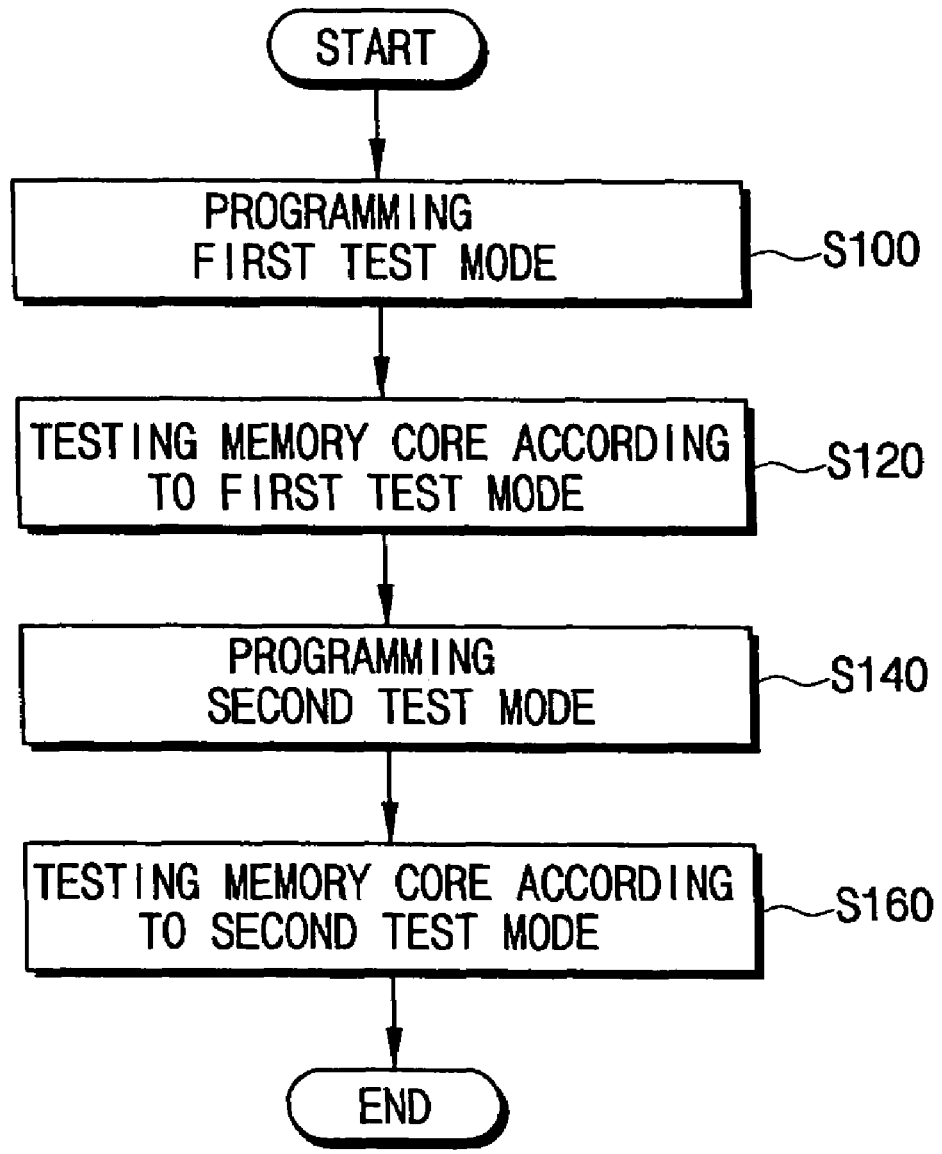
FIG. 8 is a flowchart illustrating a method of testing a semiconductor memory device according to an exemplary embodiment of the present invention.

FIG. 8 is a flowchart illustrating an exemplary method for testing a semiconductor memory device according to one embodiment of the present invention.

Referring to FIG. 8, the method preferably comprises programming the first test mode (S100). Testing a semiconductor memory device in accordance with the first test mode (S120). Programming the second test mode (S140), and thereafter testing the semiconductor memory in accordance with the second test mode (S160).

Figure 9:
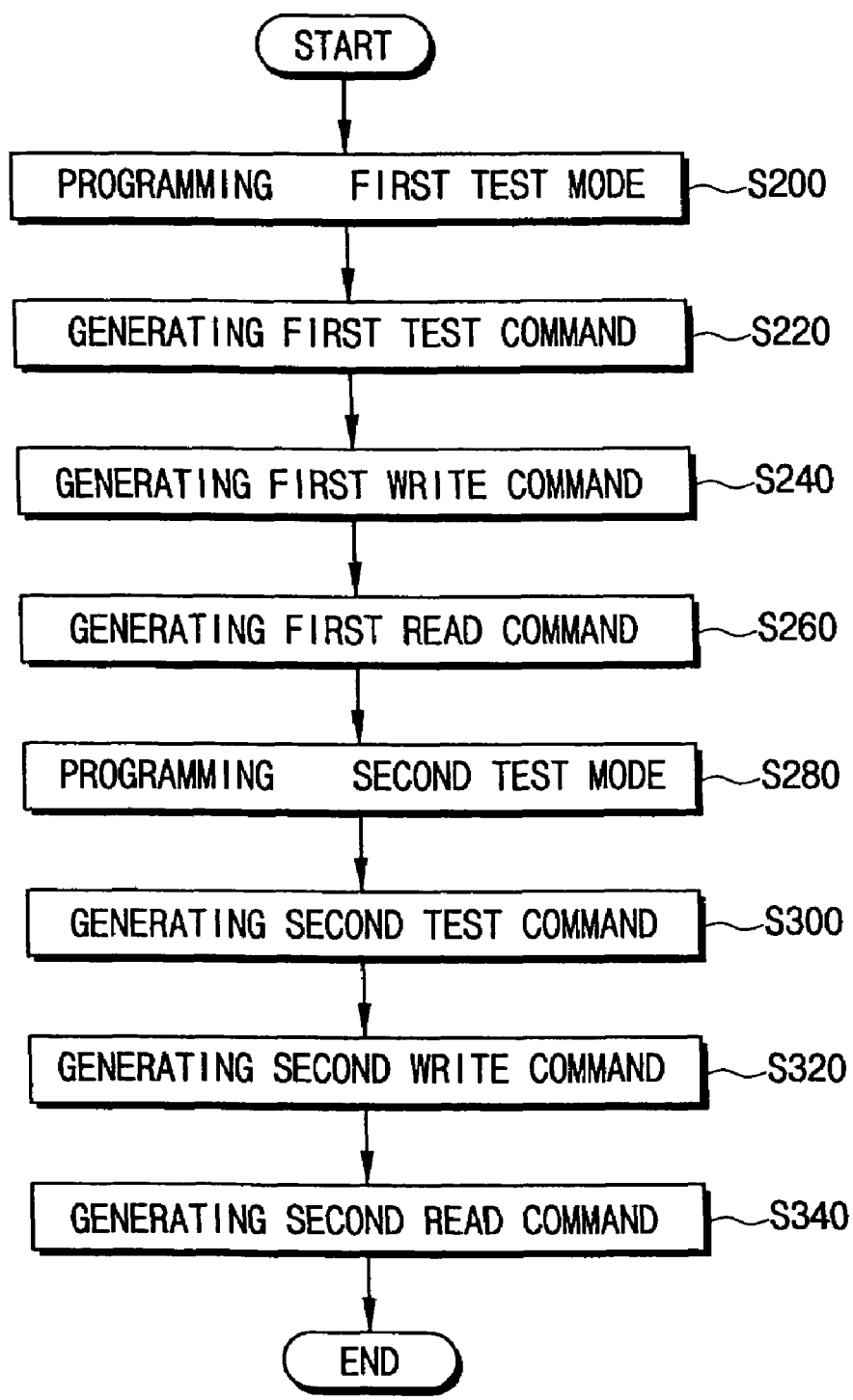
FIG. 9 is a timing diagram illustrating a method of testing a semiconductor memory device according to an exemplary embodiment of the present invention.

FIG. 9 is a flowchart illustrating another exemplary method for testing a semiconductor memory device.

Referring to FIG. 9, the method preferably comprises programming the first test mode (S200), generating a first test command in accordance with the first test mode (S220), generating a first write command (S240), and thereafter generating a first read command (S260). The method also comprises programming the second test mode (S280), generating a second test command in accordance with the second test mode (S300), generating a second write command (S320), and generating a second read command (S340).

Figure 10:
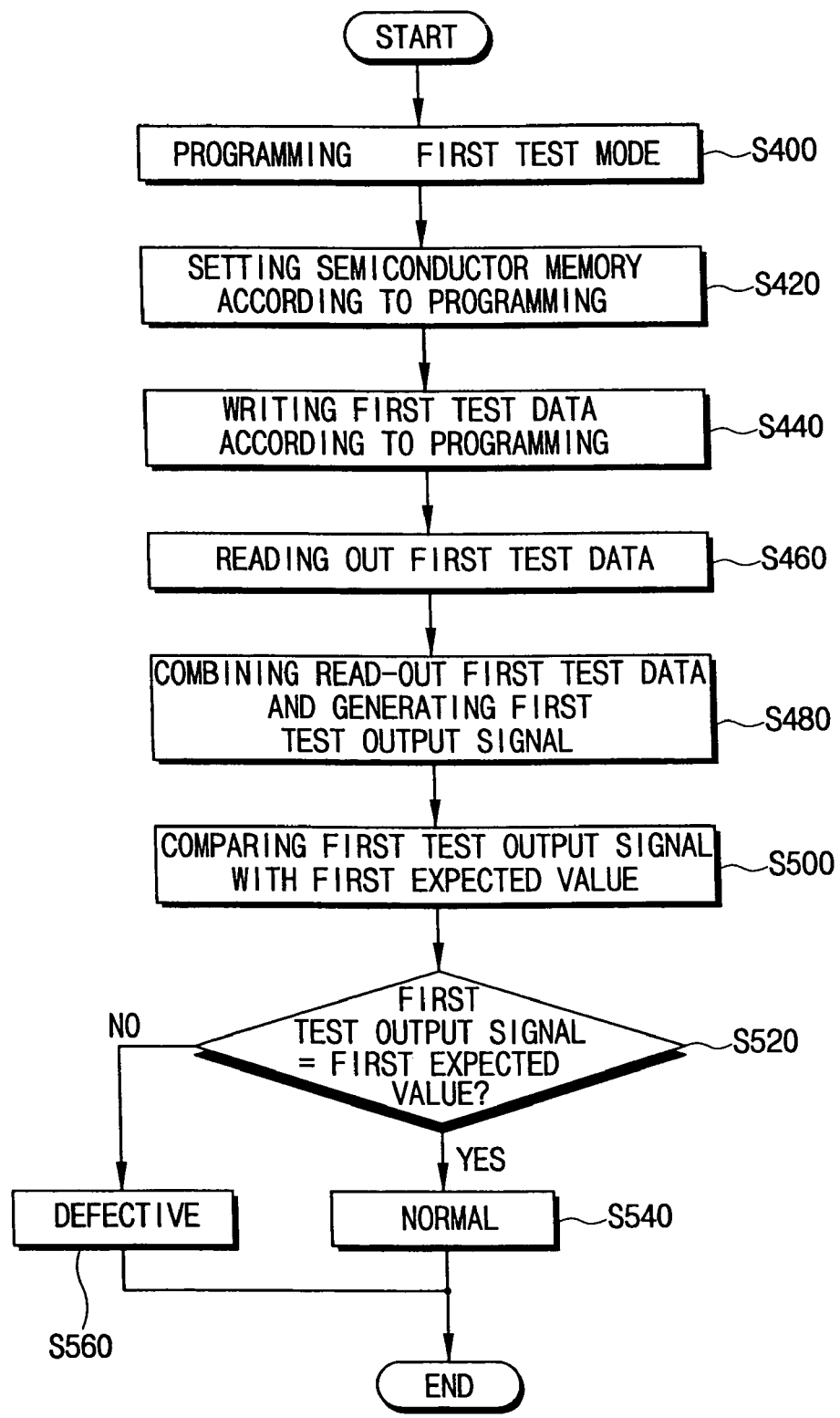
FIG. 10 is a flowchart illustrating a method of testing a semiconductor memory device according to a first test mode.

FIG. 10 is a flowchart illustrating yet another exemplary method for testing a semiconductor memory device using a first test mode.

Referring to FIG. 10, the method preferably comprises programming the first test mode (S400), setting the semiconductor memory device to operate in accordance with the first programming (S420), writing first test data to the memory core in accordance with the first programming (S440), reading the first test data from the memory core (S460), and logically combining the first test data read from the memory to generate a first test output signal having first test output value (S480).

Thereafter, the first test output value and the first expected value are compared to determine whether an error has occurred in relation to the first test mode (S500), and where the first test output value and first expected value are equal (S520), a "normal" test result is returned (S540), otherwise a "defective" test result is returned (S560).

Figure 11:
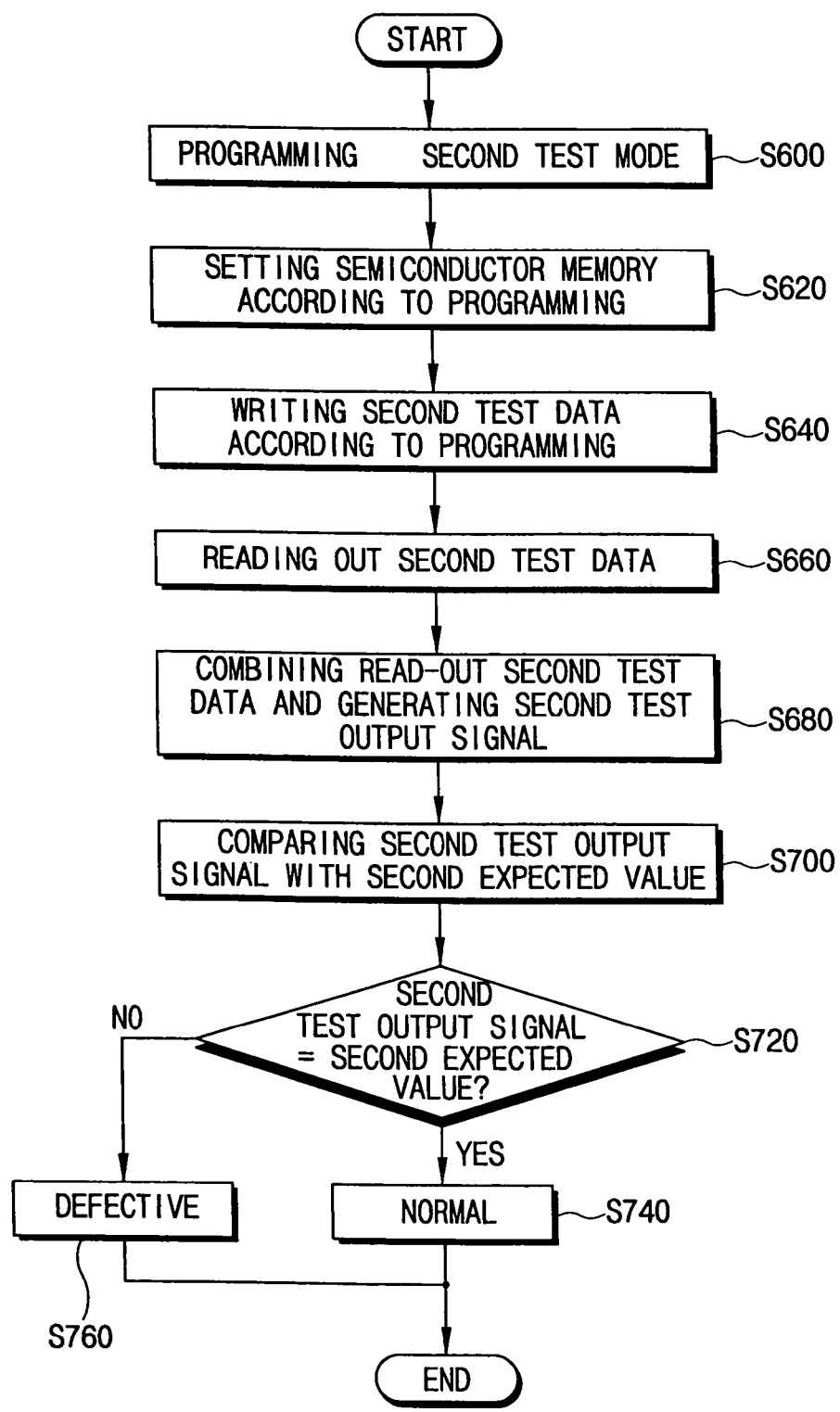
FIG. 11 is a flowchart illustrating a method of testing a semiconductor memory device according to a second test mode.

FIG. 11 is a flowchart illustrating still another exemplary method for testing the semiconductor memory device using a second test mode.

Referring to FIG. 11, the method preferably comprises programming the first test mode (S600), setting the semiconductor memory device to operate in accordance with the second programming (S620), writing first test data to the memory core in accordance with the second programming (S640), reading the second test data from the memory core (S660), and logically combining the second test data read from the memory to generate a second test output signal having second test output value (S680).

Thereafter, the second test output value and the second expected value are compared to determine whether an error has occurred in relation to the second test mode (S700), and where the second test output value and second expected value are equal (S720), a "normal" test result is returned (S740), otherwise a "defective" test result is returned (S760).

As described above, the present invention may reduce the number of pins required to test a semiconductor memory device and thereby reduce the time required to run adequate testing. In one aspect of the present invention, this result is achieved by merging some of the bits lines for testing purposes.

While the present invention has been described with respect to the several presently preferred embodiments, those of ordinary skill in the art will recognize that that various changes and modifications may be made to these embodiments without departing from the scope of the invention as defined in the following claims.

What is claimed:

1. A method of testing a semiconductor memory device, comprising:
   programming a test apparatus with a first test mode;
   merging predetermined bit lines associated with the semiconductor memory device;
   writing first test data associated with the first test mode to memory cells in the semiconductor memory device via bit lines including the merged bit lines;
   reading the first test data from the memory cells;
   performing logical operations on test data values of the first test data read from the memory cells to generate a first test output signal having a first test output value; and
   comparing the first test output value to a first expected value to generate a first error detection signal.

2. The method of claim 1, wherein the predetermined bit lines comprises at least one bit line corresponding to a parity bit.

3. The method of claim 1, further comprising:
   programming the test apparatus with a second test mode;
   separating the merged bit lines;
   writing second test data associated with the second test mode to the memory cells;
   reading the second test data from the memory cells;
   performing logical operations on test data values of the second test data read from the memory cells to generate a second test output signal having a second test output value; and
   comparing the second test output value with a second expected value to generate a second error detection signal.

4. The method of claim 3, wherein the merging predetermined bit lines comprises:
   generating a first test command in relation to the first test mode; and
   merging the predetermined bit lines in response to the first test command.

5. The method of claim 4, wherein the predetermined bit lines comprises at least one bit line associated with a parity bit, and at least one other bit line associated with data bits.

6. The method of claim 5, wherein at least one parity bit retains a data value defined by the first test mode following the writing of the second test data associated with the second test mode to the memory cells.

7. The method of claim 5, wherein separating the merged bit lines further comprises:
   generating a second test command in relation to the second test mode; and
   separating the merged bit lines in response to the second test command.

8. The method of claim 1, wherein performing logical operations on test data values of the first test data read from the memory cells to generate the first test output value further comprises:
   performing logical operations on test data values of the first test data read from the memory cells to generate first combination data;
   performing logical operations on data values of the first combination data to generate second combination data; and
   performing logical operations on data values of the second combination data to generate the first test output value.

9. The method of claim 3, wherein performing logical operations on test data values of the second test data read the from memory cells to generate the second test output value further comprises:
   performing logical operations on test data values of the second test data read from the memory cells to generate first combination data;
   performing logical operations on data values of the first combination data to generate second combination data; and
   performing logical operations on data values of the second combination data to generate the second test output value.

10. A method of testing a semiconductor memory device having a columnar arrangement of memory cells and having an odd number of bit lines including a parity bit line associated with each column, the method comprising:
    setting a first test mode by merging the parity bit and at least one bit line for each column of memory cells;
    writing data signals to the memory cells for each column of memory cells;
    reading data from the memory cells and comparing the data with a first expected value to generate a first error detection signal;
    setting a second test mode for separating the merged parity bit line and the at least one bit line for each column of memory cells;
    writing data signals to the memory cells for each column of memory cells on selected bit lines, except a bit line associated with the parity bit; and
    reading data from the memory cells and comparing the data with an expected value to generate a second error detection signal.

11. A method of testing a semiconductor memory device, comprising:
    programming an apparatus for testing the semiconductor memory device with a first test mode
    merging predetermined bit lines associated with the semiconductor memory device;
    writing first test data associated with the first test mode to memory cells in the semiconductor memory device via bit lines including the merged bit lines;
    reading the first test data from the memory cells;
    performing logical operations on test data values of the first test data read from the memory cells to generate first combination data;
    performing logical operations on data values of the first combination data to generate second combination data;

performing logical operations on data values of the second combination data to generate a first test output value; and
comparing the first test output value with a first expected value to generate a first error detection signal.

12. The method of claim 11, further comprising:
programming the apparatus for testing the semiconductor memory device with a second test mode;
separating the merged bit lines;
writing second test data associated with the second test mode to the memory cells via bit lines excepting at least one of the formerly merged bit lines;
reading the second test data from the memory cells;
performing logical operations on test data values of the second test data to generate third combination data;
performing logical operations on data values of the third combination data to generate fourth combination data;
performing logical operations on data values of the fourth combination data to generate a second test output value; and
comparing the second test output value with a second expected value to generate a second error detection.

13. The method of claim 12, wherein separating the merged bit lines further comprises:
generating a second setting signal;
generating a second test command in relation to the second setting signal; and
separating the merged bit lines in response to the second test command.

14. The method of claim 12, wherein the merged bit lines comprises at least one bit line corresponding to data, and at least one bit line corresponding to a parity bit.

15. The method of claim 14, wherein the merged bit lines comprise one parity bit line and a plurality of data bit lines.

16. The method of claim 15, wherein the value of at least one memory cell associated with the one parity bit retains a value defined by the first test mode following the step of writing the second test data to the memory cells.

17. The method of claim 11, wherein merging the predetermined bit lines further comprises:
generating a first setting signal;
generating a first test command in relation to the first setting signal; and
merging the predetermined bit lines in response to the first test command.

18. A semiconductor memory device, comprising:
a memory core comprising a plurality of memory cells and a plurality of bit lines corresponding to the plurality of memory cells;
a data write circuit writing test data to the plurality of memory cell in response to a test signal, the test signal being provided from an apparatus for testing the semiconductor memory device;
a Mode Register generating a test command to set a test mode in response to a setting signal provided from the apparatus for testing the semiconductor memory device;
a controller establishing a variable test connection for the plurality of bit lines in response to the test command; and
an output circuit reading the test data from the plurality of memory cells, and performing logical operations on test data values of the test data to generate a test output signal having a test output value.

19. The semiconductor memory device of claim 18, wherein the output circuit further comprises:
a combination circuit configured to perform logical operations on test data values of the test data read from the plurality of memory cells to generate a combination signal; and
a test value output circuit configured to generate the test output signal in response to the combination signal.

20. The semiconductor memory device of claim 19, wherein the combination circuit further comprises:
a plurality of exclusive NOR (XNOR) gates receiving the test data from the plurality of memory cells; and
a plurality of first AND gates coupled to the respective outputs of the plurality of XNOR gates.

21. The semiconductor memory device of claim 20, wherein the test value output circuit comprises a second AND gate coupled to outputs of the first AND gates.

22. A semiconductor memory device, comprising:
a memory core comprising a plurality of memory cells and a plurality of bit lines corresponding to the plurality of memory cells;
a data write circuit sequentially writing first test data related to a first test signal and second test data related to a second test signal to the plurality of memory cells, wherein the first and second test signals are provided to the semiconductor memory device from a test apparatus;
a Mode Register generating first and second test commands, the first and second test commands respectively setting first and second test modes by first and second setting signals provided from the test apparatus;
a controller merging bit lines selected from the plurality of bit lines in response to the first test command, and separating the merged bit lines in response to the second test command; and
an output circuit reading the first and second test data from the plurality of memory cells, performing logical operations on test data values of the first test data to generate a first test output signal having a first test output value, and performing logical operations on test data values of the second test data to generate a second test output signal having a second test output value.

23. The semiconductor memory device of claim 22, wherein the controller further comprises:
a merging circuit merging the bit lines in response to the first test command; and
a separating circuit separating the merged bit lines in response to the second test command.

24. The semiconductor memory device of claim 22, wherein the merged bit lines comprise at least one bit line corresponding to a parity bit.

25. The semiconductor memory device of claim 24, the parity bit retains a value defined by the first test mode following a write operation associated with the second test mode.

26. An apparatus for testing a semiconductor memory device, comprising:
a programming circuit for programming the semiconductor memory device in relation to one of a plurality of test modes;
a setting circuit merging a plurality of bit lines associated with the semiconductor memory device in response to programming a first test mode and thereafter separating the merged bit lines in response to programming a second test mode;
a signal providing circuit generating a test signal having test data defined in accordance with each one of the plurality of test modes;
a signal receiving circuit receiving the test output signal having a test output value generated in accordance with one of the plurality of test modes; and
an error detecting circuit comparing the test output value with a predefined expected value to generate an error detection signal.

27. An apparatus for testing a semiconductor memory device, comprising:
- a programming circuit sequentially programming the semiconductor memory device in first and second test modes;
- a setting circuit generating a first setting signal adapted to merge a plurality of bit lines associated with the semiconductor memory device in response to the first test mode and a second setting signal adapted to separate the merged bit lines in response to the second test mode;
- a transmitter generating a first test signal having first test data in response to the first test mode and a second test signal having second test data in response to the second test mode;
- a receiver receiving first and second test output signals having respectively first and second test output values generated in response to testing the semiconductor memory device in the first and second test modes; and
- an error detection circuit comparing the first and second test output values with predefined first and second expected values to generate first and second error detection signals.

* * * * *